United States Patent
Zhang et al.

(10) Patent No.: US 10,371,771 B2
(45) Date of Patent: Aug. 6, 2019

(54) GRADIENT AMPLIFIER SYSTEM FOR DRIVING A GRADIENT COIL AND CONFIGURATION METHOD

(71) Applicant: KONINKLIJKE PHILIPS N.V., Eindhoven (NL)

(72) Inventors: Ying Zhang, Eindhoven (NL); Gong Chen, Eindhoven (NL); Keqiu Zeng, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 171 days.

(21) Appl. No.: 15/328,536

(22) PCT Filed: Jul. 30, 2015

(86) PCT No.: PCT/EP2015/067469
§ 371 (c)(1),
(2) Date: Jan. 24, 2017

(87) PCT Pub. No.: WO2016/016356
PCT Pub. Date: Feb. 4, 2016

(65) Prior Publication Data
US 2017/0212194 A1    Jul. 27, 2017

(30) Foreign Application Priority Data

Jul. 30, 2014   (WO) ................ PCT/CN2014/083336
Nov. 5, 2014   (EP) ..................................... 14191912

(51) Int. Cl.
*G01V 3/00*     (2006.01)
*G01R 33/385*   (2006.01)

(52) U.S. Cl.
CPC .............................. *G01R 33/3852* (2013.01)

(58) Field of Classification Search
CPC .............. G01R 33/3852; G01R 33/385; G01R 33/389; G01R 33/5615; G01R 33/5616;
(Continued)

(56) References Cited

U.S. PATENT DOCUMENTS 4,471,305 A * 9/1984 Crooks .................. G01N 24/08
                                                         324/309
RE33,259 E * 7/1990 Crooks .................. G01R 33/50
                                                         324/307

(Continued)

FOREIGN PATENT DOCUMENTS

WO     2004070411 A1   8/2004

OTHER PUBLICATIONS

Siqi Li et al "Digital Controlled MOSFET Gradient Amplifier for Magnetic Resonance Imaging" Electrica Machines and Systems, IEEE Aug. 2, 2011 p. 1-6.

(Continued)

*Primary Examiner* — Rodney E Fuller

(57) ABSTRACT

A gradient amplifier system includes a gradient amplifier for driving a gradient current through the gradient coil. The gradient amplifier includes a gradient filter; a controller coupled to the gradient amplifier for controlling the gradient current in the gradient coil; a feedback loop for feeding only the gradient current in the gradient coil back to the controller. The controller is configured based on only the fedback gradient current in the gradient coil. Filter parameters of the gradient filter are adjusted to achieve a minimum shift between predetermined poles representing a desired performance of the gradient amplifier system and actual poles of a rational transfer function associated with the controller.

14 Claims, 5 Drawing Sheets

(58) Field of Classification Search
CPC ........... H02M 3/3376; H02M 3/33507; H02M 7/53871; H02J 9/062
USPC ....................................................... 324/309
See application file for complete search history.

(56) References Cited

U.S. PATENT DOCUMENTS

| | | | |
|---|---|---|---|
| 5,227,728 | A | 7/1993 | Kaufman et al. |
| 5,442,290 | A | 8/1995 | Crooks |
| 5,726,571 | A * | 3/1998 | Guclu .............. G01R 33/56518 324/307 |
| 5,909,120 | A | 6/1999 | Mori et al. |
| 6,025,720 | A | 2/2000 | Lenz et al. |
| 6,285,304 | B1 | 9/2001 | Schweighofer |
| 6,369,572 | B1 | 4/2002 | Van Groningen et al. |
| 6,552,448 | B1 * | 4/2003 | Gegner .............. G01R 33/3852 307/54 |
| 6,680,612 | B1 * | 1/2004 | McKinnon ........... G01R 33/385 324/318 |
| 2002/0017903 | A1 | 2/2002 | Heid |
| 2006/0244407 | A1 * | 11/2006 | Lawrence .............. G05B 19/40 318/685 |
| 2007/0274115 | A1 | 11/2007 | Michaels |
| 2013/0099788 | A1 | 4/2013 | Xu et al. |
| 2013/0285664 | A1 | 10/2013 | Scheel et al. |
| 2017/0343630 | A1 * | 11/2017 | Wiza ................. G01R 33/3852 |

OTHER PUBLICATIONS

Deron K Jackson et al: "A Digitally Controlled Amplifier With Ripple Cancellation", IEEE Transactions on Power Electronics, Institute of Electrical and Electronicsengineers, USA,vol. 18, No. 1, Jan. 1, 2003.

Fukuda H et al: "State-vector feedback control-based 100 kHz carrier PWM power conditioning amplifier and its high-precision current-tracking scheme".Industrial Electronics, Control, and Instrumentation, 1993. Proceeding s of the IECON '93., International Conference on Maui, HI, USA Nov. 15-19, 1993, New York,NY, USA,IEEE,Nov. 15, 1993 (Nov. 15, 1993), pp. 1105-1110.

Watanabe S et al: "Advanced digital control scheme of two-paralleled bridge type current tracking power conversion amplifier for magnetic resonance imaging". Power Electronics and Drive Systems, 1997. Proceedings., 1997 International Conference on Singapore May 26-29, 1997, New York, NY, USA, IEEE, US,vol. 1, May 26, 1997 (May 26, 1997), pp. 513-518.

Watanabe S et al: "Development of digital optimum predictive control implementation for gradient magnetic field current controller in MRI system".Power Conversion Conference, 2002.PCC-Osaka 2002. Proceedings of the Osaka,Japan Apr. 2-5, 2002, Piscataway, NJ,USA,IEEE, US,vol. 3, Apr. 2, 2002 (Apr. 2, 2002), pp. 999-1004.

* cited by examiner

GRADIENT AMPLIFIER SYSTEM FOR DRIVING A GRADIENT COIL AND CONFIGURATION METHOD

CROSS REFERENCE TO RELATED APPLICATIONS

This application is a U.S. national phase application of International Application No. PCT/EP2015/067469, filed on Jul. 30, 2015, which claims the benefit of EP Application 14191912.6 filed Nov. 5, 2014 and PCT/CN2014/083336 filed Jul. 30, 2014, both of which are incorporated herein by reference.

FIELD OF THE INVENTION

The invention relates to magnetic resonance imaging (MRI), and in particular to a gradient amplifier system for driving a gradient coil in an MRI device and a configuration method thereof.

BACKGROUND OF THE INVENTION

In an MRI device, an examination object, usually a patient, is exposed to a uniform main magnetic field ($B_0$ field) so that the magnetic moments of the nuclei within the examination object tend to rotate around the axis of the applied $B_0$ field. Then, by transmitting an RF excitation pulse ($B_1$ field) which is orthogonal to the $B_0$ field, generated by means of an RF transmit antenna, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the relaxation processes of the longitudinal and transversal components of the net magnetization begin. MR relaxation signals which are emitted by the transversal relaxation process, are detected by means of an MR/RF receive antenna. The received MR relaxation signals are then Fourier transformed to frequency-based MR spectrum signals and processed for generating an MR image of the nuclei of interest within an examination object.

In order to obtain a spatial selection of a slice or volume within the examination object and a spatial encoding of the received MR relaxation signals emanating from a slice or volume of interest, gradient magnetic fields are superimposed on the $B_0$ field, having the same direction as the $B_0$ field, but having gradients in the orthogonal x-, y- and z-directions.

For generating the gradient magnetic fields, a gradient magnet system comprising a number of gradient magnets in the form of gradient coils is provided which is typically operated by means of a gradient amplifier system for generating electrical currents for supplying the gradient coils. Usually, such gradient coil currents have a certain waveform which has to be produced by the gradient amplifier system very precisely. These current pulses have to be accurately controlled with a deviation of only several mA or less in order to ensure generation of the MRI images at a high quality and high spatial resolution and precision.

WO 2012/085777 A1 discloses a gradient amplifier system 21' for accurately controlling the current in the gradient coil. As can be seen in FIG. 1, for each gradient coil of the gradient coils 203', 204', 205' in x-, y- and z-directions, the gradient amplifier system 21' comprises a gradient amplifier 11' for driving it and a state-space feedback controller 10 operating in the digital domain for accurately controlling the current in it. The gradient amplifier 11' has a gradient filter 111' with a filter voltage and a filter current. For each gradient coil of the gradient coils 203', 204', 205' in x-, y- and z-directions, the gradient amplifier system 21' has three independent states to be measured, i.e. the current $I'_{gc}$ in that gradient coil, the filter voltage $U'_c$ and the filter current $I'_c$. As in FIG. 1, all the three independent states are fed back to the state-space feedback controller 10'. By configuring the state-space feedback controller 10', i.e. calculating proper control parameters of the state-space feedback controller 10', the current in that gradient coil is accurately controlled.

An integrated tracking control system is found in "Digital controlled MOSFET gradient amplifier for magnetic resonance imaging" by SIQI LI ET AL., Electrical machines nad systems, 20 Aug. 2011. The integrated tracking control system consists of an an optimal feedback loop, a feedforward controller and a nonlinear PI regulator. The PI regulator is implemented instead of the full-state feedback during the steady-state, so only the error signal between the reference current and the output gradient coil current is needed to be sampled precisely.

SUMMARY OF THE INVENTION

An objective of this invention is to simplify the gradient amplifier system so that the gradient amplifier system has less elements and can achieve almost the same effect of accurately controlling the current in the gradient coil.

According to an embodiment of an aspect of this invention, a gradient amplifier system for driving a gradient coil in a magnetic resonance imaging device is provided. The gradient amplifier system comprises a gradient amplifier for driving a gradient current through the gradient coil, wherein the gradient amplifier further comprises a gradient filter; a controller coupled to the gradient amplifier for controlling the gradient current in the gradient coil; a feedback loop for feeding only the gradient current back to the controller, wherein the controller is configured based on only the gradient current, and wherein filter parameters of the gradient filter are adjusted to achieve a minimum shift between predetermined poles representing a desired performance of the gradient amplifier system and actual poles of a rational transfer function associated with the controller.

In the prior art, all the three independent states, including the gradient current, the filter voltage and the filter current, are fed back to the state-space feedback controller, while this invention ignores two filter states, i.e. the filter voltage and the filter current. The gist of the invention is to provide a feedback control for a gradient amplifier system in a magnetic resonance examination system. The feedback loop only feeds back one state of the gradient amplifier system, namely its output electrical current that is applied to the gradient coil. The output filter parameters are determined by the filter capacitance and the filter inductance. These filter capacitance and inductance are designed such that the rational transfer function associated with the gradient control has its poles shifting minimally with respect to the poles without the output filter. That is, the filter capacitance and inductance are set so that (at least the dominant) poles are independent or at most very weakly dependent of the output filter. Accordingly, accurate gradient control is achieved without the need of feedback of the filter output current and voltages. That is, the feedback is done on the basis of the output electrical current (gradient coil current) and the influence of the filter current and voltage being effectively taken into account in setting the filter capacitance and inductance. Thus, the gradient amplifier system has less elements so that the cost is low and at the same time achieves almost the same effect of accurately controlling the current in the gradient coil. Advantageously, the gradient amplifier system can be optimized according to the present invention in various circumstances, such as when the gradient amplifier system is manufactured in factories or when the gradient amplifier system is in service at hospitals or the like.

According to an embodiment of this invention, the controller is realized in the form of state space feedback controller in the digital domain.

A state space feedback controller in the digital domain has many advantages over a PID controller with respect to the suppression of limited resolutions and the robustness especially with respect to a change of the control response if system parameters deviate from their nominal values.

According to an embodiment of this invention, a part of the predetermined poles are achieved as a result of controller configuration.

In this embodiment, the controller is configured to achieve a part of the predetermined poles to control the order-reduced gradient amplifier without the gradient filter, then all the predetermined poles are achieved in consideration of the state of the filter voltage and filter current. By this way, the predetermined poles are achieved step by step, which improves control accuracy of the current in the gradient coil.

According to an embodiment of this invention, the filter comprises at least one inductors and at least one capacitors, and the filter parameters comprise inductances of the at least one inductors and capacitances of the at least one capacitors.

According to an embodiment of this invention, actual poles of the amplifier system (21) are computed for different groups of possible inductances of the at least one inductors and capacitances of the at least one capacitors.

Because actual poles of the amplifier system are computed for different groups of possible inductances of the at least one inductors and capacitances of the at least one capacitors, by comparing the predetermined poles with the different actual poles computed for different inductance- and -capacitance combination, it provides an easy and fast way to find out the filter parameters of the gradient filter to approach the predetermined poles as much as possible.

According to an embodiment of this invention, the predetermined poles are pre-input to the amplifier system.

By this way, operators may input different predetermined poles based on actual need and appliance environment of the magnetic resonance imaging device, which increase flexibility of the amplifier system.

According to an embodiment of this invention, the minimum shift is only calculated between predetermined poles and actual poles of the amplifier system whose amplitudes are no larger than 1.

The advantageous effect of removing the actual poles with amplitudes larger than 1 is that, the actual poles with amplitudes larger than 1 can lead to an unstable system, thus removing such actual poles can render the current in the gradient coil more stably.

According to an embodiment of another aspect of this invention, a magnetic resonance imaging device comprising the amplifier system as above is provided.

According to an embodiment of another aspect of this invention, a method for configuring a gradient amplifier system is provided. The gradient amplifier system is configured to drive a gradient coil in a magnetic resonance imaging device and comprises a gradient amplifier for driving a gradient current through the gradient coil, and a controller coupled to the gradient amplifier for controlling the gradient current, wherein the a gradient amplifier comprises a gradient filter, and a feedback loop is used for feeding only the gradient current back to the controller, the method comprising: configuring the controller based on only the fedback gradient current; adjusting filter parameters of the gradient filter to achieve a minimum shift between predetermined poles representing a desired performance of the amplifier system (21) and actual poles actual poles of a rational transfer function associated with the controller.

According to an embodiment of this invention, the controller is realized in the form of state space feedback controller in the digital domain.

According to an embodiment of this invention, a part of the predetermined poles are achieved as a result of the configuring the controller.

According to an embodiment of this invention, the filter comprises at least one inductors and at least one capacitors, and the filter parameters comprise inductances of the at least one inductors and capacitances of the at least one capacitors.

These and other aspects of the invention will be apparent from and elucidated with reference to the embodiments described hereinafter.

DESCRIPTION OF THE DRAWINGS

The above and other objects and features of the present invention will become more apparent from the following detailed description considered in connection with the accompanying drawings, in which.

The same reference numerals are used to denote similar parts throughout the figures.

DETAILED DESCRIPTION OF THE EMBODIMENTS

Detailed description of the present invention is given below in connection with the accompanying drawings.

Figure 1:
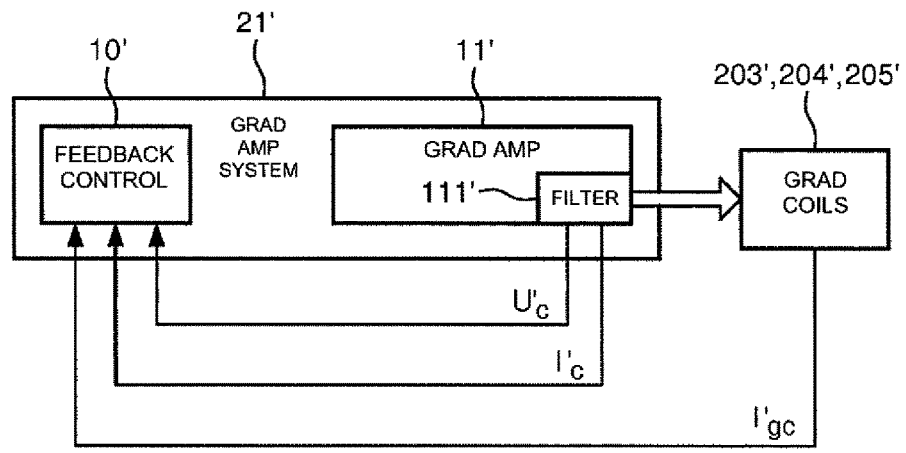
FIG. 1 shows a block figure of an amplifier system for driving a gradient coil in the prior art.
Figure 2:
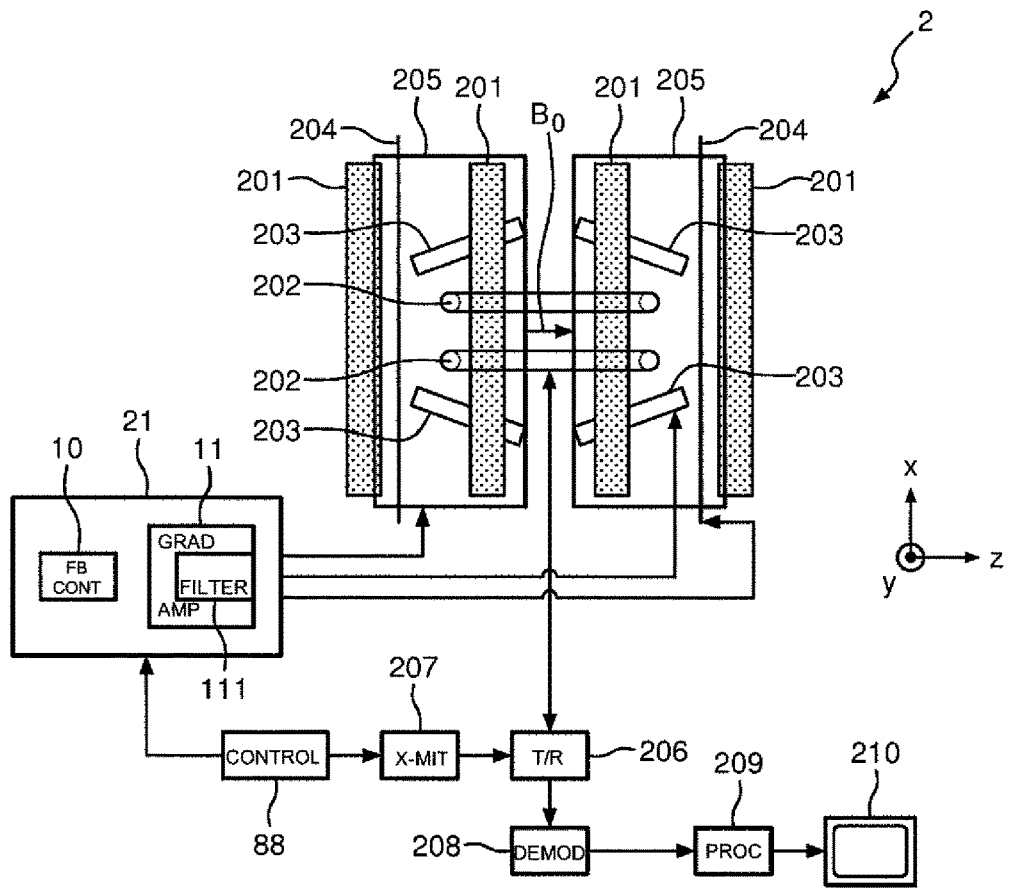
FIG. 2 shows substantial components of a magnetic resonance imaging device according to an embodiment of this invention.

FIG. 2 shows substantial components of a magnetic resonance imaging device 2 including an examination volume in which an object to be imaged is placed according to an embodiment of this invention. The magnetic resonance imaging device 2 comprises a main magnet system 201 for generating an essentially uniform and steady main magnetic field $B_0$ in the z-direction for aligning the nuclear spins in the object to be imaged. An RF/MR transmit/receive antenna arrangement 202 is provided for transmitting RF signals for generating an RF magnetic alternating field $B_1$ for exciting nuclear magnetic resonances and for receiving subsequent MR relaxation signals from the related nuclei of the object to be imaged. For the spatial selection and spatial encoding of the received MR relaxation signals emanating from the excited nuclei, the system also comprises a plurality of gradient coils 203, 204, 2055 by which gradient magnetic fields in the orthogonal x-, y- and z-directions, respectively, are generated as explained above.

Further, the magnetic resonance imaging device 2 comprises a device controller 88 which during RF transmission controls an RF transmitter unit 207 for generating the RF signals which are fed via an RF transmit/receive circuit 206 to the RF antenna arrangement 202. The received MR relaxation signals are fed via the RF transmit/receive circuit 206 to an amplifier and demodulator unit 208 and are processed by means of a processing unit 209 for generating an MR image of the examination object on a display unit 210. Further, during the MR signal reception, the device controller 88 generates control signals to a gradient amplifier system 21. For each of the gradient coils 203, 204, 205, the gradient amplifier system 21 includes a gradient amplifier 11 for generating electrical output power especially in the form of output currents for operating that gradient magnetic field coil in order to select a desired slice or volume within the examination object to be imaged on the display unit 210 as generally known. The gradient amplifier 11 has a gradient filter 111 for filtering the current to be provided to that gradient coil. For each of the gradient coils 203, 204, 205, the gradient amplifier system 21 includes a gradient amplifier 11 and the corresponding controller 10. That is, the gradient amplifier system 21 has three gradient amplifiers 11 and three corresponding controllers 10 (not shown in FIG. 2).

Figure 3:
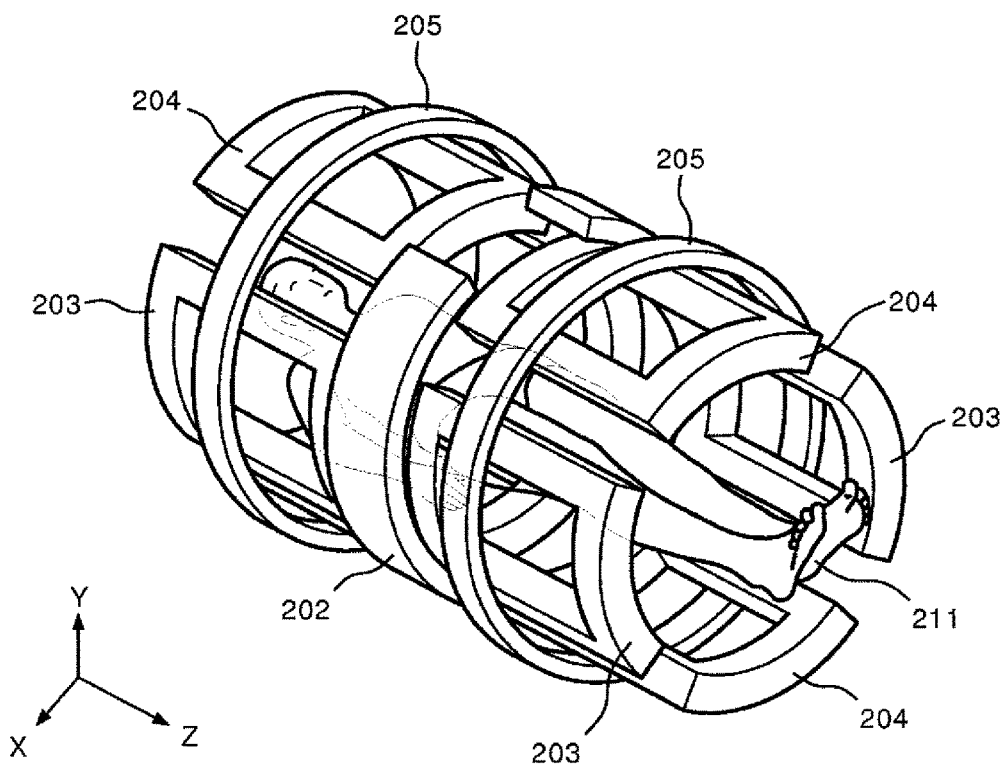
FIG. 3 shows a schematic view of an MRI magnet part of a magnetic resonance imaging device according to an embodiment of this invention.

FIG. 3 shows in more details a schematic view of the arrangement of the gradients coils 203, 204, 205 of an MRI device 2. For generating a position dependent or gradient magnetic field in the x-direction, first gradient coils 203 are provided each along both sides of an examination object 211. For generating a position dependent or gradient magnetic field in the y-direction, second gradient magnetic field coils 204 are provided each above and underneath the examination object 211. Finally, third gradient magnetic field coils 205 are provided surrounding the examination object and being displaced in the z-direction for generating a position dependent or gradient magnetic field in the z-direction. An RF/MR transmit/receive antenna arrangement 202 is also schematically indicated in FIG. 3.

Figure 4:
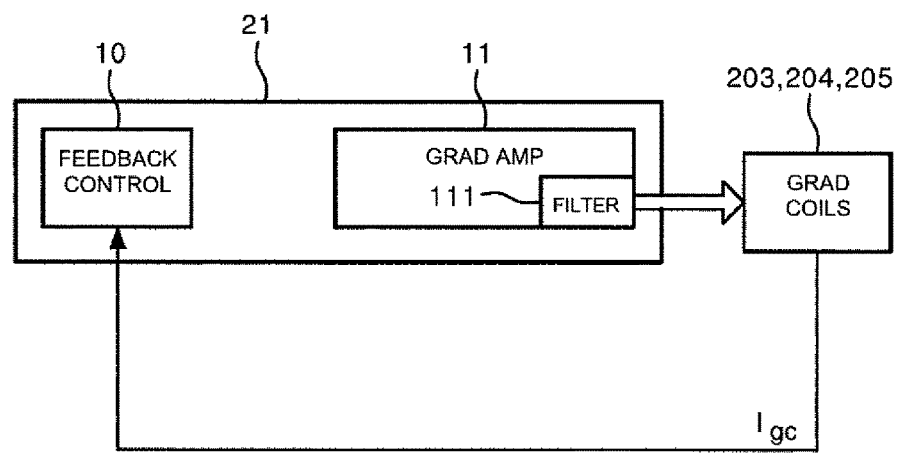
FIG. 4 shows a block figure of an amplifier system for driving a gradient coil according to an embodiment of this invention.

As shown in FIG. 4, for each of the gradient coils 203, 204, 205, the amplifier system 21 comprises: the gradient amplifier 11 for driving a gradient current through that gradient coil, wherein the gradient amplifier further comprises a gradient filter 111 with a filter voltage and a filter current; the controller 10 coupled to the gradient amplifier for controlling the gradient current in that gradient coil; a feedback loop for feeding the gradient current $I_{gc}$ in that gradient coil back to the controller, wherein the controller is configured to control an order-reduced gradient amplifier without the gradient filter based on the fedback gradient current in that gradient coil, and wherein by adjusting filter parameters of the gradient filter to achieve a minimum shift between predetermined poles and actual poles of the amplifier system 21, the configured controller is fitted to control the gradient amplifier with the gradient filter. As understood by the skilled in the art, a control system can be described using a rational transfer function. The rational transfer function can be described as a ratio in factored zero-pole form. The roots of the denominator of the rational transfer function are called the poles of the control system. The poles are locations in the s-plane where the magnitude of the transfer function becomes infinite. The poles of the control system determine its stability properties and the natural or unforced behavior of the system, referred to as the modes of the system.

For each of the gradient coils 203, 204, 205, the gradient amplifier 11 and that gradient coil have three independent states, i.e. the filter voltage, the filter current, and the gradient current in that gradient coil. In order to make full state feedback, three measurement chains including transducers are needed. In order to reduce a number of elements in the amplifier system 21, order reduction is conducted. That is, the controller is realized in the form of state space feedback controller in the digital domain to control the gradient current in that gradient coil based upon only a state of that gradient coil in replace of both the state of that gradient coil and the state of the gradient amplifier 11. The state of that gradient coil comprises the gradient current in that gradient coil, and the state of the gradient amplifier comprises the filter voltage and the filter current. Order reduction means that the two states, i.e. the filter voltage and the filter current are not considered so that the filter 111 seems not to exist at all. An order-reduced gradient amplifier means a gradient amplifier where the filter is not considered. Such order reduction may bring some system errors in the amplifier system 21, but they can be corrected by adjusting filter parameters of the gradient filter, as discussed below.

A state space controller has many advantages over a PID controller with respect to the suppression of limited resolutions and the robustness especially with respect to a change of the control response if system parameters deviate from their nominal values.

Figure 5:
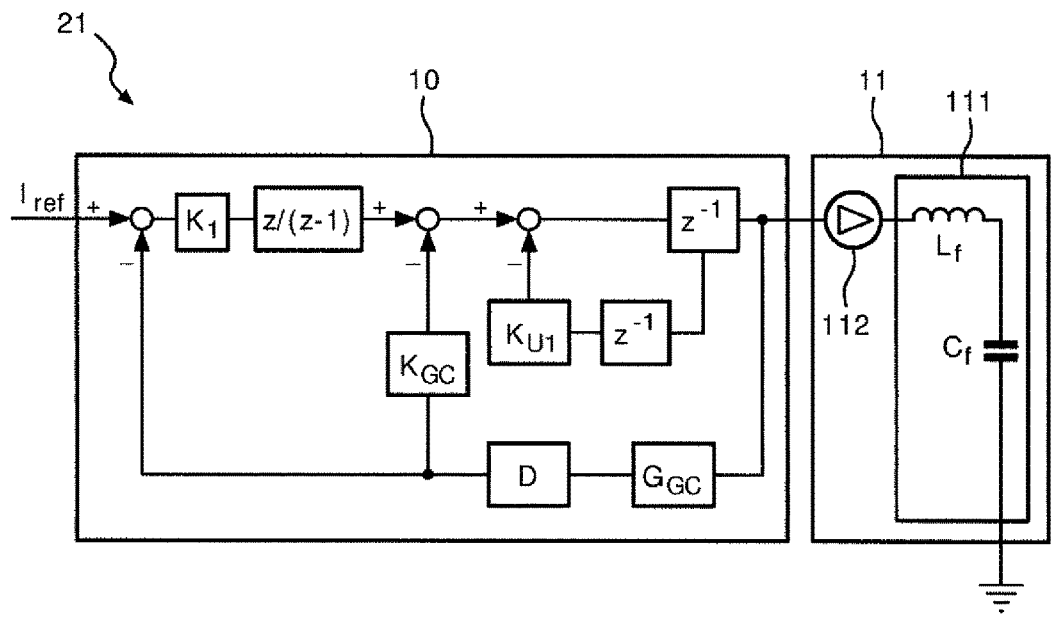
FIG. 5 shows detailed structure of an amplifier system according to an embodiment of this invention.

FIG. 5 shows detailed structure of an amplifier system 21 according to an embodiment of this invention.

In FIG. 5, for each of the gradient coils 203, 204, 205, the controller 10 comprises delay blocks $z^{-1}$ which indicates a computational delay by one clock cycle. Further, the controller 10 comprises a control factors $K_{U1}$ for the computational delay by one, clock cycle, of the output control signal of the controller 10. The controller 10 comprises a control factor $K_{GC}$ for the gradient current in that gradient coil. The controller 10 further comprises the transfer function $G_{GC}$ in series to the regular delay chain with 20 us of the measurement value of the gradient current $I_{GC}$ in that gradient coil caused by the A/D converter plus additional filtering.

In the integration block $z/(z-1)$, the control deviation which is the difference between the reference current $I_{ref}$ and the gradient current $I_{GC}$ in that gradient coil is integrated. The controller 10 further comprises a control factor $K_1$ for the control deviation. Further, the gradient current in that gradient coil, fed via the control factor $K_{GC}$, is subtracted from the output of the integration block $z/(z-1)$. And, as in FIG. 5, a further block cycle $z^{-1}$ is applied before the actual output of the controller 10.

The control factors $K_{U1}$, $K_{GC}$, etc. all influences control performance of the controller 10, thus further influencing the gradient current in that gradient coil. Thus, configuring the controller means designing the control factors $K_{U1}$, $K_{GC}$, etc. in the controller. The control factors $K_{U1}$, $K_{GC}$, etc. can be designed by known method, e.g. a pole placement method or other.

A part of the predetermined poles are achieved as a result of controller configuration to control the order-reduced gradient amplifier without the gradient filter. In particular, the part of the predetermined poles which dominate performance of the amplifier system 21 are selected to be achieved as a result of controller configuration to control the order-reduced gradient amplifier without the gradient filter. That is, the former (N–M) poles are achieved as a result of controller configuration, wherein N is the number of the predetermined poles, M is the number of the elements storing energy in the filter 111. The predetermined poles are desired poles representing desired performance of the amplifier system 21, usually pre-input to the amplifier system 21 manually. For example, the predetermined poles are pole 1 (0.9), pole 2 (0.7), pole 3 (−0.1), pole 4 (0), pole 5 (0) (ordered by degrees the poles dominate performance of the amplifier system 21 to which). The filter 111 has an inductor $L_f$ and a capacitor $C_f$. So, the former 3 poles, i.e. pole 1 (0.9), pole 2 (0.7), pole 3 (−0.1) are achieved as a result of controller configuration to control the order-reduced gradient amplifier without the gradient filter.

Then, keeping the configuration of the controller 10 unchanged, filter parameters of the gradient filter are adjusted to achieve a minimum shift between predetermined poles and actual poles of the amplifier system 21, so that the configured controller is fitted to control the gradient amplifier with the gradient filter.

The amplifier 112 is an amplifier unit. The gradient filter 111 comprises at least one inductors and at least one capacitors, and the filter parameters comprise inductances of the at least one inductors and capacitances of the at least one capacitors, which are referred to as filter inductance and filter capacitance herein, respectively. In the example of the filter 111 having an inductor $L_f$ and a capacitor $C_f$, as in FIG. 5, the filter parameters are inductance of the inductor $L_f$ and capacitance of capacitor $C_f$.

Actual poles of the amplifier system 21 are computed for different groups of possible inductances of the at least one inductors and capacitances of the at least one capacitors. In the example of the filter 111 having an inductor $L_f$ and a capacitor $C_f$, actual poles of the amplifier system 21 are computed for different groups of inductance of $L_f$ and capacitance of $C_f$. For example, inductance of $L_f$ is fixed and set to 60 uh, and capacitance of $C_f$ can change among 110 nF, 220 nF, 440 nF, 880 nF and 1760 nF to make filter resonant frequency vary from 62 kHz to 15 kHz. The following table show the shifted system poles, wherein the predetermined (desired) poles are pole 1 (0.9), pole 2 (0.7), pole 3 (−0.1), pole 4 (0), pole 5 (0).

The minimum shift is only calculated between predetermined poles and actual poles of the amplifier system 21 whose amplitudes are no larger than 1.

Figure 7:
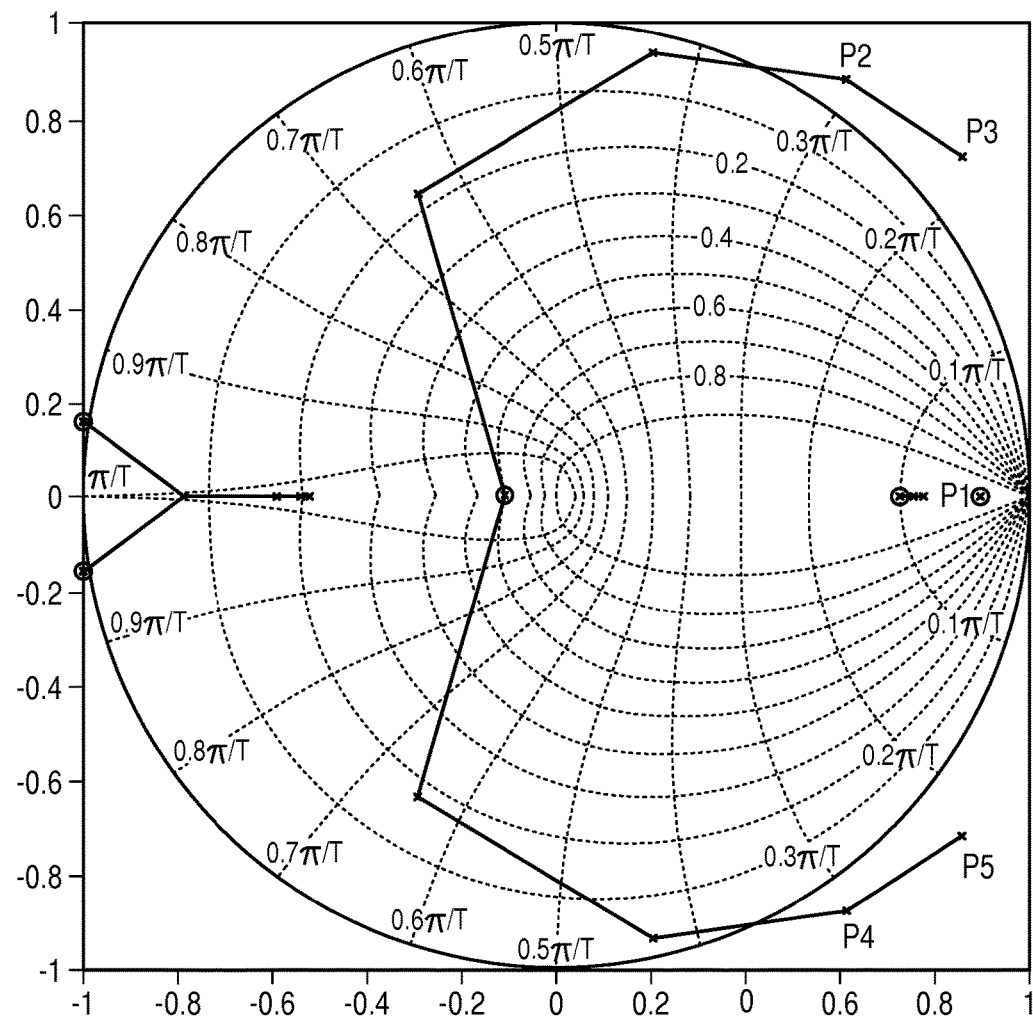
FIG. 7 shows some actual poles of the amplifier system under some possible filter parameters according to an embodiment of this invention.

FIG. 7 shows the root locus in z plane. As seen from FIG. 7, dominant pole P1 (0.9) has hardly any shift when the capacitance of $C_f$ takes different values. When the capacitance of $C_f$ is 880 nF, its Pole 4 (P2 in FIG. 8) and Pole 5 (P4 in FIG. 8) have amplitude larger than 1. When the capacitance of $C_f$ is 1760 nF, its Pole 4 (P3 in FIG. 8) and Pole 5 (P5 in FIG. 8) have amplitude larger than 1. Similarly, When the capacitance of $C_f$ is 110 nF, its Pole 4 and Pole 5 have amplitude larger than 1. When the capacitance of $C_f$ is 115, 130, 145, 160 nF respectively, its Pole 4 has amplitude larger than 1. Thus, in Table 1, capacitances of $C_f$ being 440 nF and 220 nF meet the amplitude condition.

If there are e.g. no less than 2 groups of inductances and capacitances in the filter meeting the amplitude condition, the shift is calculated. For example, if the predetermined (desired) poles are pole 1 (0.9), pole 2 (0.7), pole 3 (−0.1), pole 4 (0), pole 5 (0). When the inductance of $L_f$ is 60 uh and the capacitance of $C_f$ is 440 nF, the actual poles are pole 1 (0.9), pole 2 (0.8), pole 3 (0), pole 4 (0.1), pole 5 (0.1). When the inductance of $L_f$ is 80 uh and the capacitance of $C_f$ is 600 nF, the actual poles are pole 1 (0.9), pole 2 (0.7), pole 3 (−0.2), pole 4 (0.2), pole 5 (0.2). Thus, when the inductance of $L_f$ is 60 uh and the capacitance of $C_f$ is 440 nF, the shift is $\sqrt{0^2+0.1^2+0.1^2+0.1^2+0.1^2}=0.2$. When the inductance of $L_f$ is 80 uh and the capacitance of $C_f$ is 600 nF, the shift is $\sqrt{0^2+0^2+0.1^2+0.2^2+0.2^2}=0.3$. Therefore, the minimum shift is 0.2, and the inductance of $L_f$ being 60 uh and the capacitance of $C_f$ being 440 nF are adjusted filter parameters.

Figure 8:
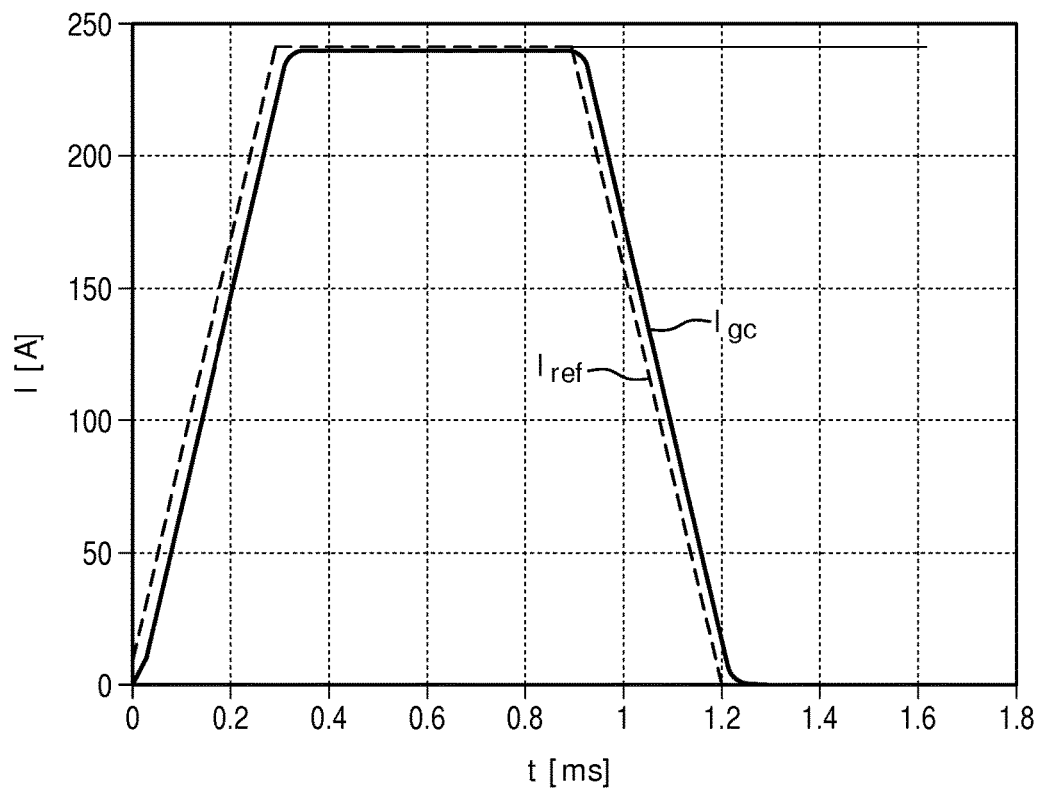
FIG. 8 shows comparison between the reference current $I_{ref}$ and the actual measured current in the gradient coil $I_{gc}$ when adopting the amplifier system according to an embodiment of this invention.

Under the condition that the inductance of $L_f$ being 60 uh and the capacitance of $C_f$ being 440 nF are adjusted filter parameters of the gradient filter, FIG. 8 shows comparison between the reference current $I_{ref}$ and the actual measured current in the gradient coil $I_{gc}$. As can be seen from FIG. 8, the the actual measured current in the gradient coil $I_{gc}$ is very close to the reference current $I_{ref}$, which illustrates that the amplifier system 21 can achieve almost the same effect of accurately controlling the current in the gradient coil as compared with the situation where the filter voltage and the filter current are also fed back. And, as compared with the situation where the filter voltage and the filter current are also fed back, the amplifier system according to an embodiment of this invention has less elements and cost effective due to lack of two feedback paths.

According to an embodiment of another aspect of this invention, a magnetic resonance imaging device 2 compris-

TABLE 1

System poles shift for order-reduced system

Figure 6:
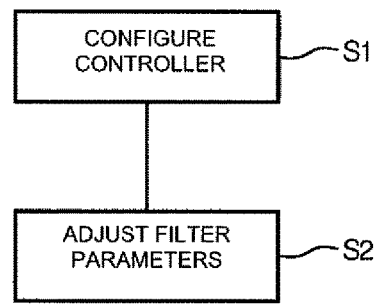
FIG. 6 shows a flow chart of a method for configuring an amplifier system according to an embodiment of this invention.

| Filter parameters | | | | $L_f$ = 60uh | | |
|---|---|---|---|---|---|---|
| $C_f$/nF | Resonant frequency/kHz | Pole1(0.9) | Pole2(0.7) | Pole3(−0.1) | Pole4(0) | Pole5(0) |
| 110 | 61.95 | 0.8971 | 0.7265 | −0.1078 | −0.9941 + 0.1578i | −0.9941 − 0.1578i |
| 115 | 60.59 | 0.8971 | 0.7271 | −0.1392 | −1.1113 | −0.8466 |
| 130 | 56.99 | 0.8971 | 0.7284 | −0.2783 | −1.2221 | −0.5535 |
| 145 | 53.96 | 0.8971 | 0.7296 | −0.3936 + 0.2121i | −1.1793 | −0.3936 − 0.2121i |
| 160 | 51.37 | 0.8971 | 0.7307 | −0.3828 + 0.326i | −1.0909 | −0.3828 − 0.326i |
| 220 | 43.8 | 0.897 | 0.7342 | −0.7866 | −0.2921 + 0.6379i | −0.2921 − 0.6379i |
| 440 | 30.97 | 0.8968 | 0.7441 | −0.5904 | 0.2049 + 0.9397i | 0.2049 − 0.9397i |
| 880 | 21.9 | 0.8965 | 0.7588 | −0.5384 | 0.617 + 0.8812i | 0.617 − 0.8812i |
| 1760 | 15.49 | 0.8957 | 0.7793 | −0.5174 | 0.8617 + 0.7188i | 0.8617 − 0.7188i | ing the amplifier system 21 as above is provided. According to an embodiment of another aspect of this invention, a method for configuring an amplifier system 21 is provided. The amplifier system 21 is configured to drive a gradient coil 203, 204, 205 in a magnetic resonance imaging device and comprises a gradient amplifier 11 for driving a gradient current through the gradient coil, and a controller 10 coupled to the gradient amplifier for controlling the gradient current in the gradient coil, wherein the a gradient amplifier 11 comprises a gradient filter 111 with a filter voltage and a filter current, and a feedback loop is used for feeding the gradient current in the gradient coil back to the controller. As shown in FIG. 6, the method comprising: configuring S1 the controller to control an order-reduced gradient amplifier without the gradient filter based on the fedback gradient current in the gradient coil; adjusting S2 filter parameters of the gradient filter to achieve a minimum shift between predetermined poles and actual poles of the amplifier system 21, so that the configured controller is fitted to control the gradient amplifier with the gradient filter.

According to an embodiment, the controller is realized in the form of state space feedback controller in the digital domain to control the gradient current in the gradient coil based upon only a state of the gradient coil in replace of both the state of the gradient coil and the state of the gradient amplifier.

According to an embodiment, the state of the gradient coil comprises the gradient current in the gradient coil, and the state of the gradient amplifier comprises the filter voltage and the filter current.

According to an embodiment, a part of the predetermined poles are achieved as a result of the configuring S1 the controller to control an order-reduced gradient amplifier without the gradient filter.

According to an embodiment, the filter comprises at least one inductors and at least one capacitors, and the filter parameters comprise inductances of the at least one inductors and capacitances of the at least one capacitors.

It should be noted that the above-mentioned embodiments illustrated rather than limit the invention and that those skilled in the art would be able to design alternative embodiments without departing from the scope of the appended claims. The embodiments are illustrative rather than restrictive. It is intended that the invention include all modifications and variations to the illustrated and described embodiments within the scope and spirit of the invention. In the claims, any reference signs placed between parentheses shall not be construed as limiting the claim. The word "comprising" does not exclude the presence of elements or steps not listed in a claim or in the description. The word "a" or "an" preceding an element does not exclude the presence of a plurality of such elements. In the device claims enumerating several units, several of these units can be embodied by one and the same item of hardware or software. The usage of the words first, second and third, et cetera, does not indicate any ordering. These words are to be interpreted as names.

The invention claimed is:

1. A gradient amplifier system for driving a gradient coil in a magnetic resonance imaging device, the gradient amplifier system comprising a gradient amplifier for driving a gradient current through the gradient coil, wherein the gradient amplifier further comprises a gradient filter, a controller coupled to the gradient amplifier for controlling the gradient current in the gradient coil, wherein the gradient amplifier system is describable by a rational transfer function and actual poles of the rational transfer function is dependent on controller configuration and gradient filter configuration, the gradient amplifier system further comprising:
    a feedback loop for feeding a state limited to the gradient current back to the controller, wherein the controller is configured by determining control factors of the controller based on the state limited to the feedback gradient current to achieve a part of predetermined poles of the rational transfer function independent of or the most weakly dependent on the gradient filter, and wherein the gradient filter is configured after the configuration of the controller by determining filter inductance and/or filter capacitance of the gradient filter to achieve actual poles shifting minimally with respect to the predetermined poles.

2. The gradient amplifier system of claim 1, wherein the predetermined poles are pre-input to the gradient amplifier system.

3. The gradient amplifier system of claim 1, wherein the minimum shift is only calculated between the predetermined poles and actual poles whose amplitudes are no larger than 1.

4. A magnetic resonance imaging device comprising the gradient amplifier system according to claim 1.

5. A gradient amplifier system for driving a gradient coil in a magnetic resonance imaging device, the gradient amplifier system comprising:
    a gradient amplifier configured to drive a gradient current through the gradient coil;
    a gradient filter;
    a state space feedback controller in the digital domain coupled to the gradient amplifier for controlling the gradient current in the gradient coil;
    a feedback loop configured to feed a state limited to the gradient current back to the state space feedback controller, wherein the state space feedback controller is configured by determining control factors of the state space feedback controller based on the state limited to the feedback gradient current to achieve a part of predetermined poles of a rational transfer function independent of feedback from the gradient filter;
    wherein the gradient amplifier system is describable by the rational transfer function and actual poles of the rational transfer function is dependent on a configuration of the state space feedback controller; and
    wherein the gradient filter is configured after the configuration of the state space feedback controller by determining filter inductance and/or filter capacitance of the gradient filter to achieve actual poles shifting minimally with respect to the predetermined poles.

6. The gradient amplifier system of claim 5, wherein the state space feedback controller is configured to control the gradient current in the gradient coil based only on a state of the gradient coil and not on a state of the gradient amplifier.

7. The gradient amplifier system of claim 6, wherein the state of the gradient coil includes a gradient current in the gradient coil.

8. The gradient amplifier system of claim 6, wherein the state of the gradient amplifier includes a filter voltage and a filter current.

9. The gradient amplifier system of claim 8, wherein the state space feedback controller does not consider the filter voltage or the filter current.

10. The gradient amplifier system according to claim 6, wherein the gradient amplifier system does not include a feed forward loop.

11. A method for configuring a gradient amplifier system described by a rational transfer function, the gradient amplifier system being configured to drive a gradient coil in a magnetic resonance imaging device and comprising a gradient amplifier for driving a gradient current through the gradient coil, and a controller coupled to the gradient amplifier for controlling the gradient current in the gradient coil, wherein the a gradient amplifier comprises a gradient filter, actual poles of the rational transfer function dependent on controller configuration and gradient filter configuration, the method comprising:
- feeding a state limited to the gradient current back to the controller;
- configuring the controller by determining control factors of the controller based on the state limited to the feedback gradient current to achieve a part of predetermined poles of the rational transfer function independent of or the most weakly dependent on the gradient filter;
- configuring the gradient filter by determining filter inductance and/or filter capacitance of the gradient filter to achieve actual poles shifting minimally with respect to the predetermined poles after the controller configuring.

12. The method of claim 11, wherein the controller is realized in the form of state space feedback controller in the digital domain.

13. The method of claim 11, further comprising:
- obtaining different groups of actual poles for different groups of filter inductance and filter capacitance; and
- comparing shifts of the actual poles groups with respect to the predetermined poles to obtain the minimum shift.

14. The method of claim 11, further comprising:
- obtaining different groups of actual poles for different groups of filter inductance and filter capacitance;
- determining one or more actual poles groups without actual poles whose amplitudes are larger than 1; and
- comparing shifts of the determined actual poles groups with respective to the predetermined poles to obtain the minimum shift.

* * * * *